United States Patent
Rahaman et al.

(10) Patent No.: US 9,395,418 B2
(45) Date of Patent: Jul. 19, 2016

(54) SYSTEM AND METHOD FOR DETERMINING THE STATE OF HEALTH OF ELECTROCHEMICAL BATTERY CELLS

(75) Inventors: Azizur Rahaman, Oak Brook, IL (US); Timothy J. Moran, Chicago, IL (US)

(73) Assignee: Methode Electronics, Inc., Chicago, IL (US)

(*) Notice: Subject to any disclaimer, the term of this patent is extended or adjusted under 35 U.S.C. 154(b) by 555 days.

(21) Appl. No.: 13/494,383

(22) Filed: Jun. 12, 2012

(65) Prior Publication Data
US 2012/0316814 A1    Dec. 13, 2012

Related U.S. Application Data (60) Provisional application No. 61/496,117, filed on Jun. 13, 2011.

(51) Int. Cl.
G01R 31/36 (2006.01)

(52) U.S. Cl.
CPC .................. *G01R 31/3679* (2013.01)

(58) Field of Classification Search
CPC ............... G01R 31/3679; G01R 31/36; G01R 31/3606; G01R 31/3658; G01R 31/3682; G01R 31/3686; G01R 31/3689; G01R 31/3648; G01R 31/3624; H02J 7/0031; H02J 7/0047; H02J 2007/004; H02J 2007/0049; H02J 2007/005
USPC ...................... 702/60, 63; 320/132, 134–136; 324/201, 207.21, 228, 239, 426, 432
See application file for complete search history.

(56) References Cited

U.S. PATENT DOCUMENTS

| | | | |
|---|---|---|---|
| 6,150,809 A | 11/2000 | Tiernan et al. | |
| 6,329,792 B1* | 12/2001 | Dunn et al. | 320/132 |
| 6,456,988 B1* | 9/2002 | Singh et al. | 706/2 |
| 6,472,991 B1* | 10/2002 | Schulman et al. | 340/995.1 |
| 6,668,247 B2 | 12/2003 | Singh et al. | |
| 7,072,871 B1 | 7/2006 | Tinnemeyer | |
| 7,615,967 B2* | 11/2009 | Cho et al. | 320/132 |
| 7,788,052 B2 | 8/2010 | Iwane et al. | |
| 2009/0115420 A1 | 5/2009 | Koch et al. | |
| 2010/0079145 A1* | 4/2010 | Meisner et al. | 324/432 |
| 2011/0074432 A1* | 3/2011 | Tinnemeyer | 324/426 |
| 2012/0194198 A1 | 8/2012 | Moran | |

FOREIGN PATENT DOCUMENTS

| | | |
|---|---|---|
| JP | H11346444 A | 12/1999 |
| JP | 2002340821 A | 11/2002 |
| JP | 2007178333 A | 7/2007 |
| JP | 2010048759 A | 3/2010 |
| JP | 2010142083 A | 6/2010 |

(Continued)

*Primary Examiner* — Manuel L Barbee
(74) *Attorney, Agent, or Firm* — Blank Rome LLP; Brian W. Higgins (57) ABSTRACT

A system and method for determining the state of health of a battery. In particular, the present invention is related to a system and method for determining the state of health of an electrochemical battery cell by obtaining state of charge measurements for the battery cell, and using the state of charge measurements to calculate the state of health of the battery cell, wherein the state of charge measurements are based on the magnetic susceptibility of the battery cell. The system includes a sensing device for measuring the magnetic susceptibility of the battery cell, and a computing device for performing the steps of the disclosed method.

23 Claims, 3 Drawing Sheets

(56) References Cited

FOREIGN PATENT DOCUMENTS

| JP | 2010-145308 A | 7/2010 |
| JP | 2011522262 A | 7/2011 |
| JP | 2012517094 A | 7/2012 |
| WO | WO-2009146547 A1 | 12/2009 |
| WO | WO-2010091170 A1 | 8/2010 |

* cited by examiner

SYSTEM AND METHOD FOR DETERMINING THE STATE OF HEALTH OF ELECTROCHEMICAL BATTERY CELLS

CROSS-REFERENCE TO RELATED APPLICATIONS

The present application is related to and claims the benefit of U.S. Provisional Patent Application No. 61/496,117, filed Jun. 13, 2011, the entirety of which is incorporated herein by reference.

BACKGROUND OF THE INVENTION

1. Field of the Invention

The present invention relates to systems and methods for determining the state of health of a battery, as well as batteries and related devices that facilitate determining the state of health. In particular, the present invention is related to a system and method for determining the state of health of an electrochemical battery cell by obtaining state of charge measurements for the battery cell, and using the state of charge measurements to calculate the state of health of the battery cell, wherein the state of charge measurements are based on the magnetic susceptibility of the battery cell.

2. Description of the Related Art

A battery includes one or more battery cells, connected in a series and/or parallel arrangement, that chemically store electrical charge potential (energy) and deliver the charge at a pre-determined voltage when demanded by an external electric circuit load. Each of the battery cells contains two half-cells connected in series by an electrolyte, which may be a solid or a liquid. The electrolyte consists of anions (i.e., negatively-charged ions) and cations (i.e., positively-charged ions). One of the half-cells contains some of the electrolyte and an anode (i.e., negative electrode), toward which anions migrate. The other half-cell contains some of the electrolyte and a cathode (i.e., positive electrode) toward which cations migrate. The electrodes do not touch each other but are electrically connected by the electrolyte.

During battery cell operation, a redox (reduction-oxidation) reaction powers the battery cell. That is, the cations in the electrolyte are reduced (i.e., by the addition of electrons) at the cathode, and the anions are oxidized (i.e., by the removal of electrons) at the anode. As a battery cell discharges, ions flow from the anode, through the electrolyte, to the cathode. As the battery cell charges, the ions flow from the cathode, through the electrolyte, to the anode.

The state of charge of a battery cell refers to the instant charge of the battery cell relative to the charge of the battery cell when the battery cell is fully charged. For example, the state of charge of a battery cell may decrease from approximately 100% to approximately 0% during a complete discharge cycle, and may increase from approximately 0% to approximately 100% during a complete charge cycle.

A theoretically perfect battery cell is capable of storing a charge that is a function of its design parameters and materials, delivering the charge to an external electrical load, and then being fully recharged to its original capacity. Thus, if one were to measure the total charge (i.e., amp-hours) entering the battery cell during a charge cycle, and subtract from that measurement the total charge exiting the battery cell during a discharge cycle, the resulting value would be an accurate indicator of the state of charge of the battery cell (i.e., the amount of energy stored within the battery cell).

Because the charge is stored chemically, however, each charge/discharge cycle (as well as normal temperature cycling, vibration, shock, etc.) results in irreversible changes within the individual battery cells, the changes affecting battery capacity. Moreover, the rate of charge and/or discharge can also manifest in changes to battery capacity. The common result of these changes is that less energy is stored in the battery during each subsequent charge cycle. The state of health of a battery cell refers to the instant capacity of the battery cell relative to the original capacity of the battery cell. For example, the state of health of a battery cell may be approximately 100% upon manufacturing of the battery cell, and may continually decrease as the age and/or use of the battery cell increases.

Because the state of health of a battery cell degrades over time, the theoretical state of charge, which can be determined by the aforementioned method of subtracting the amount of charge used from the amount of charge initially placed in the battery cell, may differ from the actual state of charge of the battery cell (i.e., the theoretical state of charge will be greater than the actual state of charge due to battery cell degradation).

Accordingly, there is a need for a system and method for determining the state of health of a battery cell, as the state of health provides an indication of the capacity of the battery cell, the age of the battery cell, and the rate at which the battery cell ages.

U.S. Pat. No. 6,668,247 describes a system and method for determining the state of health of a lead-acid battery, the system and method involving monitoring impedance of the battery and training a fuzzy system in a relationship between the impedance and the number of charge cycles the cell has undergone. U.S. Pat. No. 7,072,871 describes a method for determining the state of health of a battery, which may have one of a variety of chemistry types, by measuring multiple parameters, such as internal resistance, voltage, temperature, etc., and training a fuzzy system to provide the battery state of health. Those prior art methods of assessing the state of health, however, are complicated and depend on many battery parameters and extensive records of historical data related to the batteries.

SUMMARY OF THE INVENTION

Accordingly, it is a principal object of the present invention to provide a system and method for non-invasively measuring, directly or indirectly, the state of charge, and determining the state of health, of an electrochemical battery cell.

It is another object of the present invention to provide a system and method for measuring a magnetic susceptibility property of one or more electrochemical cells within a battery to determine the age and the rate of aging of the battery.

It is still another object of the present invention to provide a system and method for improving the operating band of a battery cell.

It is still another object of the present invention to provide a sensor platform that, through battery cell performance improvement, advances opportunities for the development and commercialization of electric vehicles and hybrid electric vehicles.

It is still another object of the present invention to provide a system and method for using state of health information to improve cell chemistry, cell packaging, battery systems, and implementation of state of health systems, to improve overall electric vehicle performance.

Other advantages of the present invention are as follows. The present invention may improve performance of a battery cell performance by providing the battery cell with the ability to expand closer to the "knee." As a battery is only as good as its weakest cell, the present invention provides for the production of optimized battery modules with commonly performing cells, thereby improving the battery.

The present invention provides for the accurate determination of the state of health of batteries in motor vehicles that have not been operated for long periods of time, for example, during transit.

The present invention provides for vehicles to expand their ranges of battery operation or to reduce the number of cells required in a battery.

The present invention provides for the anticipation of the need for cell replacement vs. battery replacement or cell by cell system level elimination of the weak cell.

The present invention provides accurate real time knowledge of battery cell health, which includes the knowledge of the "break off" of the lithium cathode material.

The present invention provides overall safety for a battery system.

The present invention also provides an understanding of the charge storage potential within battery cells (i.e., to better understand the "total" storage capability and plan for proper management of loads).

Those and other objects of the present invention may be achieved by a computer-implemented method for determining the state of health of an electrochemical battery cell including the steps of: measuring a magnetic susceptibility property of the battery cell; and calculating a state of health value for the battery cell based on the measured magnetic susceptibility property.

The method may include the steps of: measuring the magnetic susceptibility property of the battery cell to determine a measured magnetic susceptibility value; estimating a state of charge value for the battery cell based on the measured magnetic susceptibility value in combination with voltage and current history information for the battery cell; calculating an estimated magnetic susceptibility value corresponding to the state of charge value; and calculating a state of health value for the battery cell based on an offset between the measured magnetic susceptibility value and the estimated magnetic susceptibility value.

The method may further include the steps of storing the state of health value on a storage device, and displaying the state of health value using a display device. The steps of the method may be performed on each one of a plurality of battery cells within a battery to determine an overall state of health value for the battery.

The step of measuring the magnetic susceptibility property may be repeated at a pre-determined frequency, such as once per second, or once per minute. The step of calculating the state of health value may be performed after each measuring step. The measured magnetic susceptibility property may be a magnetic field.

Those and other objects of the present invention may be achieved by a system for determining the state of health of an electrochemical battery cell, the system comprising: a sensing device for measuring a magnetic susceptibility of a battery cell; and a computing device for calculating a state of health value for the battery cell based on the measured magnetic susceptibility.

The system may include a processing device for determining a measured magnetic susceptibility value; estimating a state of charge value for the battery cell based on the measured magnetic susceptibility value in combination with voltage and current history information for the battery cell; calculating an estimated magnetic susceptibility value corresponding to the state of charge value; and calculating a state of health value for the battery cell based on an offset between the measured magnetic susceptibility value and the estimated magnetic susceptibility value.

The system may further include a storage device for storing the state of health value, and an output device for outputting the state of health value. The state of health value, and other data, may be transmitted via wired or wireless connections within the system, or may be transferred via wired or wireless connections to one or more other components not within the system.

With those and other objects, advantages, and features of the present invention that may be hereinafter apparent, the nature of the present invention may be more clearly understood by reference to the following detailed description of the invention, the appended claims, and to the several drawings attached herein.

DETAILED DESCRIPTION OF THE PREFERRED EMBODIMENTS

Figure 1:
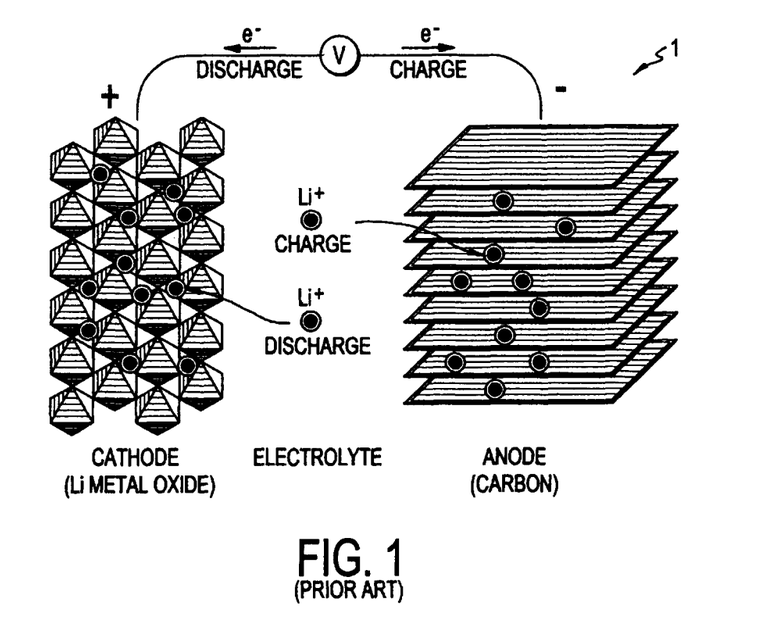
FIG. 1 illustrates a charge/discharge mechanism for a battery cell in accordance with an exemplary embodiment of the present invention.

Turning to FIG. 1, shown therein is an illustration of the charge/discharge mechanism for an exemplary lithium-based (Li-based) electrochemical battery cell 1. The cathode reaction for the battery cell 1 shown in FIG. 1 is described by the equation:

$$LiFe^{+2}PO_4 \rightarrow Li_{1-x}Fe^{+3}PO_4 + xLi^+ + xe^-$$

During charging, the oxidation state of Fe changes from +2 to +3, and the number of unpaired electrons in the d-shell changes. The magnetic moment due to the unpaired electrons is as follows:

Over the life of a Li-based battery cell, some of the Li ion within the cell may form other compounds and, therefore, not participate in the electrochemical reaction. An exemplary embodiment of the present invention provides a system and method for measuring the magnetic susceptibility of Li-based battery cells to estimate the amount of Li ion that does not participate in the electrochemical reaction within the battery cell. That is, the present invention involves measurement of the Li-ion active battery material to assess its magnetic susceptibility, which is linearly related to the state of charge of the battery cell, thereby providing a determination of the state of health of the battery cell.

Reference to Li-based batteries in this disclosure is for illustrative purposes only. It is contemplated that the present invention may be used with other types of electrochemical battery cells such as, but not limited to, nickel-cadmium (NiCd), lead-acid, nickel-metal hydride (NiMH), and nickel-zinc (NiZn) based batteries.

Figure 2:
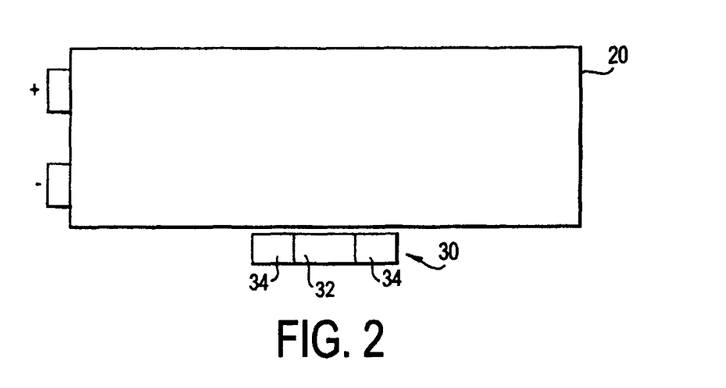
FIG. 2 illustrates a magnetic susceptibility sensor in accordance with an exemplary embodiment of the present invention proximate to a battery cell.

Turning now to FIG. 2, shown therein are a battery cell 20, and a sensing device 30 disposed proximate to the battery cell 20. An exemplary sensing device 30, is described in U.S. patent application Ser. No. 13/339,931, the entirety of which is incorporated herein by reference. The sensing device may include means, such as one or more permanent magnets 32, for applying a magnetic field to the battery cell 20. The sensing device 30 may further include one or more magnetic field sensors 34, such as fluxgate sensors, for measuring a magnetic field. The sensing device 30 provides a non-invasive means for applying and measuring magnetic fields.

Figure 3:
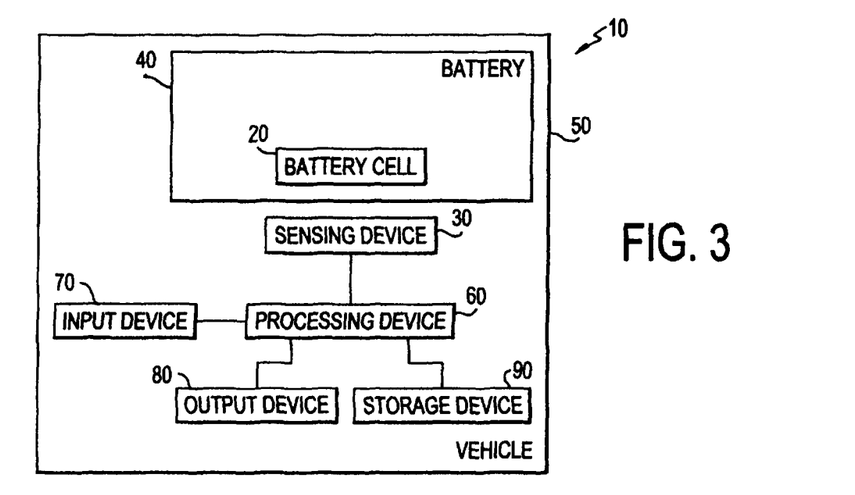
FIG. 3 is a block diagram of an exemplary system in which the present invention may operate.

FIG. 3 is a block diagram illustrating an exemplary system 10 in which the present invention may operate. The system 10 includes the battery cell 20 and the sensing device 30. The system may include an additional system or device (not shown) connected to the battery cell 20 for charging and/or discharging the battery cell 20. The system 10 may also include a processing device 60 or controller in electrical communication with the sensing device 30 to perform various functions and operations in accordance with the present invention. The processing device may be configured to calculate the magnetic susceptibility of the battery cell 20 based on the measured magnetic field. The processing device 60 may be provided with one or more of a wide variety of components or subsystems including, for example, a co-processor, register, and data processing devices and subsystems. The processing device 60 may be in wired or wireless communication with the one or more sensing devices 30, input devices 70, output devices 80, and storage devices 90. The system 10 may include a computer-readable medium, such as a hard disk, having stored thereon machine executable instructions for performing processes in accordance with the methods described herein. Specifically, the system may include one or more input devices 70, such as a keyboard, keypad, touchscreen, touchpad, or pointing device; one or more output devices 80, such as a monitor, display screen, printer, or audio device for accessing state of charge and state of health data; and one or more storage device 90, such as a database, hard disk, portable drive, RAM, or ROM for storing the data.

The system 10 may comprise a battery 40, which includes one or more battery cells 20 connected in series and/or parallel for delivering power to an external circuit load (not shown). Each individual battery cell 20 in the battery 40 may have a corresponding sensing device 30 disposed proximate thereto for measuring the state of charge of the battery cell 20. In an exemplary embodiment of the present invention, the system 10 includes an electric vehicle 50, which derives power from the battery 40.

In an exemplary embodiment of the present invention, the size of the sensing device 30 may be approximately 16 mm×6 mm×6 mm. Power requirements may be less than about 20 mA. The output of the sensing device 30 may be analog, pulse-width modulated (PWM), controller area network (CAN), and transmitted via wires or wirelessly. Preferably, when the system 10 comprises an electric vehicle battery 40, the sensing device 30 may withstand vibration and very high/low operating temperatures (e.g., from −94° C. to 210° C.), and have a life of at least 450,000 miles of road use.

In an exemplary operation of the present invention, the sensing device 30 applies a magnetic field that permeates the battery cell 20. Simultaneously, the sensing device 30 measures a resultant magnetic field proximate the battery cell 20. The magnitude of the measured magnetic field is linearly related to the magnetic susceptibility of the battery cell 20, as shown by the equations:

$$B = \mu_0(H + 4\pi M)$$
$$= \mu_0(1 + \chi_v)H$$
$$= \mu_r H$$

where H is the applied magnetic field, M is the magnetization of the battery cell 20, B is the measured magnetic field, $\chi_v$ is the magnetic susceptibility of the battery cell 20, $\mu_0$ is the magnetic constant, and $\mu_r$ is the magnetic permeability of the battery cell 20.

The sensing device 30 is configured to provide an output that is representative of the measured magnetic field. Because the induced magnetization of the battery cell 20 is linearly related to the measured magnetic field, the magnetic susceptibility of the battery cell 20 can be calculated based on the output of the sensing device 30 using a suitable transfer function related to output voltage. Furthermore, because the magnetic susceptibility of the battery cell 20 is linearly related to the actual state of charge of the battery cell 20, the state of charge of the battery cell 20 can be calculated based on the output of the sensing device 30.

Figure 4:
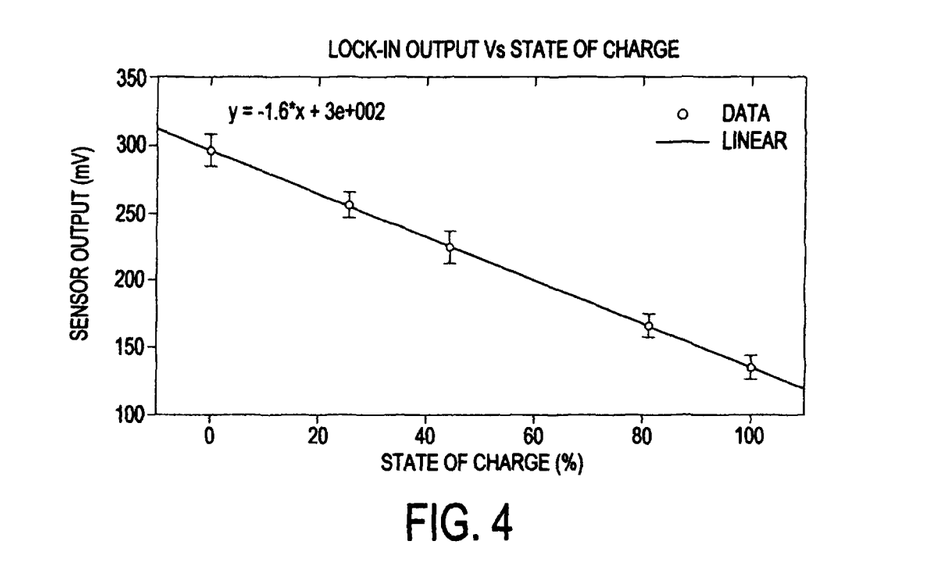
FIG. 4 is a graph depicting the state of charge of a battery cell versus the output of a sensing device based on data that was collected and processed in accordance with an exemplary embodiment of the present invention.
Figure 5:
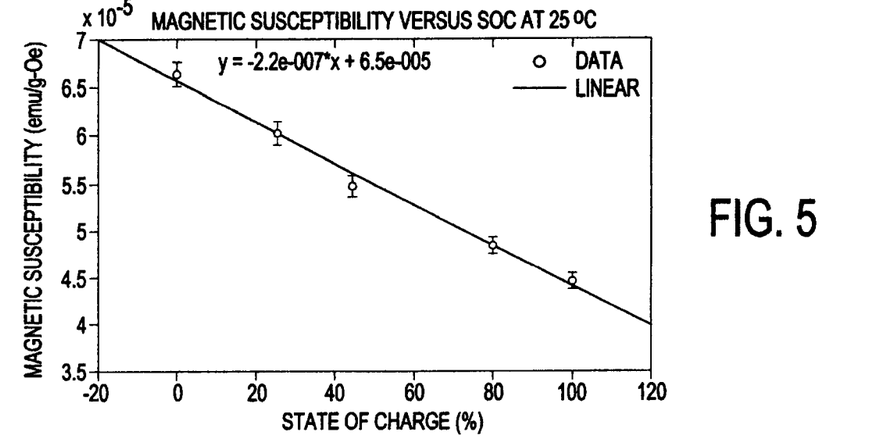
FIG. 5 is a graph depicting the state of charge of a battery cell versus the measured magnetic susceptibility of the battery cell based on data that was collected and processed in accordance with an exemplary embodiment of the present invention.

FIG. 4 is a graph depicting the state of charge of a battery cell 20 versus the output of a magnetic susceptibility sensing device 30 based on data that was collected and processed in accordance with an exemplary embodiment of the present invention, and FIG. 5 is a graph depicting the state of charge of a battery cell 20 versus the measured magnetic susceptibility of the battery cell 20 based on data that was collected and processed in accordance with an exemplary embodiment of the present invention. FIG. 4 illustrates the linear relationship between the state of charge of the battery cell 20 and the output of the sensing device 30 FIG. 5 illustrates the linear relationship between the state of charge and magnetic susceptibility of the battery cell 20.

The data presented in FIGS. 4 and 5 was collected with a sensor assembly connected to drive electronics and a lock-in amplifier. The sensor assembly included a solenoid for exciting the electrochemical battery cell 20 with an AC magnetic field, and magnetic field sensors 34 which detected the magnetic field produced inside the electrochemical battery cell 20 in response to the excitation field. The magnetic field sensors 34 were connected to an amplification circuit, the output of which was connected to a lock-in amplifier. The lock-in amplifier was used to detect the magnetic field component which was related to the AC excitation field, thus indicating the magnetic susceptibility of the electrochemical battery cell 20.

During operation of an exemplary embodiment of the present invention, a sensing device 30 is placed in proximity with a battery cell 20. In the exemplary embodiment shown in FIG. 2, a permanent magnet 32 is provided for applying a DC excitation magnetic field to the battery cell 20. Alternatively, an AC excitation magnetic field may be applied to the battery cell 20, for example, by a solenoid. Magnetic field sensors 34 within the sensing device 30 sense a resultant magnetic field, and the sensing device 30 outputs a signal indicative of the resultant magnetic field. A processing device 60 calculates the magnetic susceptibility, and thereby the state of charge of the battery cell 20, each of which is linearly related to the output of the sensing device 30.

Figure 6:
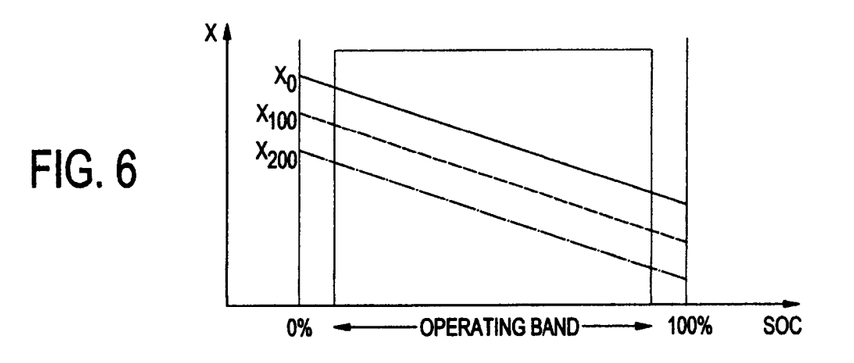
FIG. 6 is a graph illustrating the state of charge versus the magnetic susceptibility of a battery cell for multiple charge/discharge cycles, in accordance with an exemplary embodiment of the present invention.

FIG. 6 is a graph illustrating the state of charge versus the magnetic susceptibility of an exemplary battery cell 20 for three separate charge/discharge cycles. As illustrated in FIG. 6, as the battery cell 20 charges, the state of charge of the battery cell 20 increases, and the magnetic susceptibility of the battery cell 20 decreases. The first curve $\chi_0$, shown as a solid line, represents the magnetic susceptibility of the battery cell 20 during a 0th charge/discharge cycle. The second curve $\chi_{100}$, shown as a dashed line, represents the magnetic susceptibility of the battery cell 20 during a 100th charge/discharge cycle. The third curve $\chi_{200}$, shown as a dotted line, represents the magnetic susceptibility of the battery cell 20 during a 200th charge/discharge cycle. The offsets between the curves $\chi_0$, $\chi_{100}$, $\chi_{200}$ are a result of the varying contributions of the state of health of the battery cell 20 to the magnetic susceptibility of the battery cell 20, at various charge/discharge cycles of the battery cell 20. The offsets between the curves $\chi_0$, $\chi_{100}$, $\chi_{200}$ are independent of the state of charge of the battery cell 20.

Also shown in FIG. 6 is an operating band, which corresponds to a range of state of charge values for which the battery cell 20 is capable of operating properly. The operating band is designed to prevent the cell from being in an over-charged state or an over-discharged state. In conventional systems that do not involve magnetic susceptibility measurements, the operating band may be limited due to inaccuracies in the methods used to determine the state of charge of the battery cell 20.

The measured magnetic susceptibility $\chi_{MEAS}$ of the battery cell 20 may be described by the following equation.

$$\chi_{MEAS} = \chi_{OFFSET} - \chi_{SOC} - \chi_{SOH}$$

where $\chi_{OFFSET}$ is a value, based on characteristics of the battery cell 20, that remains constant throughout the life of the battery cell 20. $\chi_{SOC}$ is a state of charge contribution that changes as the battery cell 20 charges or discharges. $\chi_{SOH}$ is a state of health contribution that is assumed to be constant over the course of a single charge/discharge cycle.

Minimum and maximum values of $\chi_{SOC}$ occur when the battery cell 20 is fully charged or fully discharged, respectively, regardless of the number of charge/discharge cycles the battery cell 20 has undergone. $\chi_{SOC}$ may be written as m×SOC, where the value of m depends on magnetic properties of the active battery material, such as $LiFePO_4$, in the battery cell 20 and remains constant throughout the life of the battery cell 20, and SOC is the state of charge of the battery cell 20, as determined based on the measured magnetic susceptibility of the battery cell 20 in combination with the voltage and current history of the battery cell 20.

The state of health contribution $\chi_{SOH}$ is negligible at the beginning of the life of the battery cell 20. However, the state of health contribution $\chi_{SOH}$ continuously increases over the life of the battery cell 20, due to the deposition and/or erosion of materials within the battery cell 20 during charging and discharging of the battery cell 20. The deposition and/or erosion process may be accelerated by over-charging and over-discharging of the battery cell 20. By using magnetic sensing to determine the state of health contribution $\chi_{SOH}$, the state of health of the battery cell 20 and its remaining lifetime can be estimated.

Figure 7:
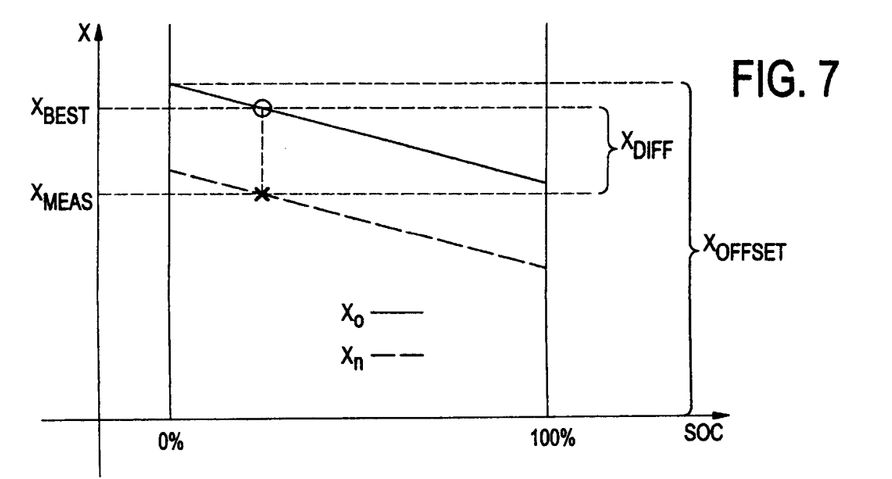
FIG. 7 is a graph illustrating the state of charge versus the magnetic susceptibility of a battery cell for multiple charge/discharge cycles, in accordance with an exemplary embodiment of the present invention.

With reference to FIG. 7, the present invention combines information from the measured magnetic susceptibility $\chi_{MEAS}$ and the voltage and current histories of the battery cell 20 to determine a state of health value. To accomplish this, a combination of information from the measured magnetic susceptibility $\chi_{MEAS}$, the voltage history, and the current history of the battery cell 20, is used to determine a state of charge value. Then, an expected magnetic susceptibility value $\chi_{BEST}$, corresponding to that state of charge value, is calculated. $\chi_{BEST}$ is the best estimate of the magnetic susceptibility based on the best estimate of the state of charge, where the present magnetic signal, the voltage history, and the current history have been used to determine the best estimate of the state of charge. The difference $\chi_{DIFF}$ between $\chi_{BEST}$ and $\chi_{MEAS}$ represents the magnetic susceptibility contribution of the material changes in the battery cell 20 that are due to aging of the battery cell 20. $\chi_{DIFF}$, which is equivalent to the $\chi_{SOH}$ term described above, therefore indicates the state of health of the battery cell 20.

In FIG. 7, the X symbol corresponds to $\chi_{MEAS}$, and is located on the $\chi_n$ line, which represents an nth charge/discharge cycle of the battery cell 20. The X symbol represents the status of the battery cell 20 at a certain time, where the measured magnetic susceptibility is represented by the vertical axis, and the best estimate (from the present magnetic susceptibility, the voltage history, and the current history) of the SOC value is represented by the horizontal axis. The O symbol, which corresponds to $\chi_{BEST}$, is located along the $\chi_0$ line, directly above the X symbol. Because the X symbol does not lie along the $\chi_0$ line representing the original state of health of the battery cell 20, it can be inferred that the state of health of the battery cell 20 has degraded in the period between the 0th and the nth charge/discharge cycles. The vertical difference between the X and the O symbols represents the difference in magnetic susceptibility that is due to the change in the state of health of the battery cell 20. The determination of the state of health of the battery cell based on the calculated value of $\chi_{DIFF}$, described above, is equivalent to converting the vertical difference between the X and O symbols into a value indicating the amount of change in state of health of the battery cell 20.

Because variation in the voltage output of the battery cell 20 due to charge flow will be the greatest when the battery cell 20 is close to being fully charged or fully discharged, voltage and current history information gathered when the battery cell 20 is close to being fully charged or fully discharged will be most valuable in providing state of charge estimations and state of health estimations.

By utilizing detailed histories of the voltage and current, mathematical models, and magnetic susceptibility data to estimate a state of charge value, the present invention provides better estimation of state of charge than was possible with the prior art.

Because the change in state of health of the battery cell 20 is a relatively slow process, the state of health can be determined when the battery cell 20 is not in use, or as required, based on charge/discharge data stored in the memory of the system 10.

The magnetic susceptibility of the battery cell 20 is a fundamental physical quantity, absolute in terms of the present status of the active battery material. Accordingly the present invention, which involves measurement of the magnetic susceptibility of the battery cell 20, provides a robust method of determining the state of charge of the battery cell 20. Furthermore, the accuracy of the state of health determination depends solely upon the accuracy of the state of charge measurement. Because of the accuracy of the system 10, a wider operating band (i.e., 40% more than that of conventional systems) may be utilized.

The present invention further provides for the real-time determination of the state of health of a battery cell 20.

The system 10 and method described herein may be applied to each one of a plurality of battery cells 20 within a battery 40 to determine an overall state of health for the battery 40.

The state of health value determined according to the present invention may be outputted to an output device 80. For example, the state of health value may be outputted to a display device that is viewable by the driver of the vehicle 50. The display device may display an indicia of the state of health value, such as the state of health value itself, or a bar or light, for example, from which the state of health value may be understood by the viewer. The state of health value may be stored in a storage device 90, such as the memory of a vehicle's on-board computer. The state of health value (or values) may be made available as diagnostic data for various purposes, including scheduling regular preventative or emergency maintenance or replacement of a battery 40, and for other purposes.

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

What is claimed is:

1. A computer-implemented method for determining the state of health of an electrochemical battery cell comprising the steps of:
   using a non-invasive sensing device to measure a magnetic susceptibility property of the battery cell, the sensing device comprising:
      a permanent magnet providing an excitation magnetic field; and
      one or more magnetic field sensors for sensing a magnetic field generated by the battery cell; and
   calculating a state of health value for the battery cell based on the measured magnetic susceptibility property by comparing an offset between a measured magnetic susceptibility value corresponding to the magnetic susceptibility property and an estimated magnetic susceptibility value.

2. The method according to claim 1 further comprising the step of displaying an indicia of the state of health value using a display device.

3. The method according to claim 1, wherein the steps are performed on each one of a plurality of battery cells within a battery to determine an overall state of health value for the battery.

4. The method according to claim 1, wherein the step of measuring the magnetic susceptibility property is repeated after a pre-determined period.

5. The method according to claim 4, wherein the step of calculating the state of health value is repeated after each measuring step.

6. The method according to claim 1, wherein the step of measuring the magnetic susceptibility property is repeated every second.

7. The method according to claim 1, wherein the step of measuring the magnetic susceptibility property is repeated every minute.

8. The method according to claim 1, wherein the state of health value is transmitted via a wireless connection.

9. A system for determining the state of health of an electrochemical battery cell, the system comprising:
   a non-invasive sensing device for measuring a magnetic susceptibility property of the battery cell, the sensing device comprising:
      a permanent magnet providing an excitation magnetic field; and
      one or more magnetic field sensors for sensing a magnetic field generated by the battery cell; and
   a processing device for calculating a state of health value for the battery cell based on the measured magnetic susceptibility property by comparing an offset between a measured magnetic susceptibility value corresponding to the magnetic susceptibility property and an estimated magnetic susceptibility value.

10. The system of claim 9 further comprising an output device for outputting the state of health value, wherein the output device is a display device.

11. A computer-implemented method for determining the state of health of an electrochemical battery cell comprising the steps of:
    measuring a magnetic susceptibility property of the battery cell to determine a measured magnetic susceptibility value; wherein the measuring is performed by a non-invasive sensing device comprising:
       a permanent magnet providing an excitation magnetic field; and
       one or more magnetic field sensors for sensing a magnetic field generated by the battery cell;
    estimating a state of charge value for the battery cell based on the measured magnetic susceptibility value in combination with voltage and current history information for the battery cell;
    calculating an estimated magnetic susceptibility value corresponding to the state of charge value; and
    calculating a state of health value for the battery cell based on an offset between the measured magnetic susceptibility value and the estimated magnetic susceptibility value.

12. The method according to claim 11 further comprising the step of outputting the state of health value using an output device, wherein the output device is a display device.

13. The method according to claim 11, wherein the steps are performed on each one of a plurality of battery cells within a battery to determine an overall state of health value for the battery.

14. The method according to claim 11, wherein the step of measuring the magnetic susceptibility property is repeated after a pre-determined period.

15. The method according to claim 14, wherein the step of calculating the state of health value is repeated after each measuring step.

16. The method according to claim 11, wherein the step of measuring the magnetic susceptibility property is repeated every second.

17. The method according to claim 11, wherein the step of measuring the magnetic susceptibility property is repeated every minute.

18. The method according to claim 11, wherein the state of health value is transmitted via a wireless connection.

19. A system for determining the state of health of an electrochemical battery cell, the system comprising:
   a device for generating an excitation magnetic field;
   one or more magnetic field sensors for sensing a magnetic field generated by the battery cell; and
   a processing device programmed for determining a measured magnetic susceptibility value; estimating a state of charge value for the battery cell based on the measured magnetic susceptibility value in combination with voltage and current history information for the battery cell; calculating an estimated magnetic susceptibility value corresponding to the state of charge value; and calculating a state of health value for the battery cell based on an offset between the measured magnetic susceptibility value and the estimated magnetic susceptibility value.

20. The system of claim 19 further comprising an output device for outputting the state of health value.

21. A computer-implemented method comprising the steps of:
   using a non-invasive sensing device to apply an excitation magnetic field to a battery cell, the sensing device comprising a permanent magnet for generating the excitation magnetic field, and one or more magnetic field sensors;
   using the sensing device to measure a magnetic susceptibility property of the battery cell by sensing a magnetic field generated by the battery cell at a pre-determined time after it is magnetized by the excitation magnetic field; and
   calculating a state of health value for the battery cell based on the measured magnetic susceptibility property.

22. A computer-implemented method comprising the steps of:
   using a non-invasive sensing device to apply a magnetic field to a battery cell, the sensing device comprising a means for generating magnetic fields, and the sensing device further comprising one or more magnetic field sensors;
   using the sensing device to measure a magnetic susceptibility property of the battery cell to determine a measured magnetic susceptibility value;
   estimating a state of charge value for the battery cell based on the measured magnetic susceptibility value in combination with voltage and current history information for the battery cell;
   calculating an estimated magnetic susceptibility value corresponding to the state of charge value; and
   calculating a state of health value for the battery cell based on an offset between the measured magnetic susceptibility value and the estimated magnetic susceptibility value.

23. A system comprising:
   a non-invasive sensing device for measuring a magnetic susceptibility property of a battery cell, the sensing device comprising a means for generating magnetic fields, and the sensing device further comprising one or more magnetic field sensors; and
   a processing device for
      determining a measured magnetic susceptibility value;
      estimating a state of charge value for the battery cell based on the measured magnetic susceptibility value in combination with voltage and current history information for the battery cell;
      calculating an estimated magnetic susceptibility value corresponding to the state of charge value; and
      calculating a state of health value for the battery cell based on an offset between the measured magnetic susceptibility value and the estimated magnetic susceptibility value.

* * * * *